United States Patent
Shen et al.

(10) Patent No.: US 9,123,771 B2
(45) Date of Patent: Sep. 1, 2015

(54) SHALLOW TRENCH ISOLATION INTEGRATION METHODS AND DEVICES FORMED THEREBY

(71) Applicant: GLOBALFOUNDRIES Inc., Grand Cayman (KY)

(72) Inventors: Hongliang Shen, Malta, NY (US); Kyutae Na, Malta, NY (US); Sandeep Gaan, Malta, NY (US); Hsin-Neng Tai, Malta, NY (US); Weihua Tong, Mechanicville, NY (US); Sang Cheol Han, Clifton Park, NY (US); Tae Hoon Kim, Malta, NY (US); Ja Hyung Han, Clifton Park, NY (US); Haigou Huang, Rexford, NY (US); Changyong Xiao, Mechanicville, NY (US); Huang Liu, Mechanicville, NY (US); Seung Yeon Kim, Andover, MA (US)

(73) Assignee: GlobalFoundries Inc., Grand Cayman (KY)

( * ) Notice: Subject to any disclaimer, the term of this patent is extended or adjusted under 35 U.S.C. 154(b) by 0 days.

(21) Appl. No.: 13/765,723

(22) Filed: Feb. 13, 2013

(65) Prior Publication Data

US 2014/0227858 A1    Aug. 14, 2014

(51) Int. Cl.
H01L 21/762    (2006.01)
H01L 21/02    (2006.01)

(52) U.S. Cl.
CPC .... H01L 21/76224 (2013.01); H01L 21/02123 (2013.01); H01L 21/76229 (2013.01)

(58) Field of Classification Search
CPC .................................................. H01L 31/02109
See application file for complete search history.

(56) References Cited

U.S. PATENT DOCUMENTS

| | | | | |
|---|---|---|---|---|
| 8,329,552 B1 * | 12/2012 | Peng et al. | ..... | 438/424 |
| 2005/0167778 A1 * | 8/2005 | Kim et al. | ..... | 257/510 |
| 2005/0266647 A1 * | 12/2005 | Kim et al. | ..... | 438/296 |
| 2007/0205489 A1 * | 9/2007 | Tilke et al. | ..... | 257/618 |
| 2008/0217702 A1 * | 9/2008 | Oishi | ..... | 257/397 |
| 2009/0029556 A1 * | 1/2009 | Liao et al. | ..... | 438/703 |
| 2012/0178235 A1 * | 7/2012 | Pachamuthu et al. | ..... | 438/421 |

* cited by examiner

Primary Examiner — Cheung Lee
(74) Attorney, Agent, or Firm — Williams Morgan, P.C.

(57) ABSTRACT

Aspects of the present invention generally relate to approaches for forming a semiconductor device such as a TSV device having a "buffer zone" or gap layer between the TSV and transistor(s). The gap layer is typically filled with a low stress thin film fill material that controls stresses and crack formation on the devices. Further, the gap layer ensures a certain spatial distance between TSVs and transistors to reduce the adverse effects of temperature excursion.

19 Claims, 12 Drawing Sheets

SHALLOW TRENCH ISOLATION INTEGRATION METHODS AND DEVICES FORMED THEREBY

BACKGROUND

1. Technical Field

This invention relates generally to the field of semiconductors and, more particularly, to shallow trench isolation (STI) integration methods/schemes for improved wet etch removal rates and etch stopping.

2. Related Art

In current fin-based field effect transistor (FinFET) integration schemes, enhanced High Aspect Ratio Process (eHARP) is often utilized for shallow trench isolation (STI) gap fill. However, due to poor eHARP film density, severe STI-oxide recess was discovered in downstream processes. Such phenomena resulted in fin damage and poor device performance.

SUMMARY OF THE INVENTION

In general, aspects of the present invention relate to approaches for forming a semiconductor device such as a FinFET device through the use of multiple protective liners between bi-layers of refill. In a typical embodiment, a set of trenches will be etched in a substrate (e.g., silicon (Si)). A shallow trench isolation (STI) layer will then be formed. The STI layer will include a first liner layer (e.g., an in-situ steam generation (ISSG)-based layer) and a second liner layer (e.g., silicon nitride (SiN) or poly-silicon). The set of trenches will then be filled (e.g., over the second liner layer) via an enhanced high aspect ratio process (eHARP) material, which will then be polished and etched back. The second liner layer will then be removed (e.g., via a hot phosphorous process or a direct thermal treatment process depending on the material used in the second liner layer), and the set of trenches will be (re)filled with a high density plasma (HDP) material that is subsequently polished and etched back. In one embodiment, a silicon layer may be deposited after the second liner layer has been removed (but before the HDP fill) for additional protection during downstream wet/dry clean processes).

A first aspect of the present invention provides a method for forming a semiconductor device, comprising: etching a set of trenches in a substrate; forming a first liner layer over the set of trenches; forming a second liner layer over the first liner layer; filling the set of trenches over the second liner layer with a first fill material; polishing and etching back the first fill material; removing the second liner layer; and refilling the set of trenches with a second fill material.

A second aspect of the present invention provides a method for forming a semiconductor device, comprising: etching a set of trenches in a substrate; forming a first liner layer over the set of trenches; forming a second liner layer over the first liner layer; filling the set of trenches over the second liner layer via an enhanced high aspect ratio process (eHARP); polishing and etching the semiconductor device after the filling; removing the second liner layer; and filling the set of trenches with a high density plasma (HDP).

A third aspect of the present invention provides a method for forming a semiconductor device, comprising: etching a set of trenches in a substrate; forming a shallow trench isolation (STI) layer, the STI layer comprising a first liner layer and a second liner layer; filling the set of trenches over the second liner layer via an enhanced high aspect ratio process (eHARP); polishing and etching the semiconductor device after the filling; removing the second liner layer; filling the set of trenches with a high density plasma (HDP); polishing the HDP; and etching back the HDP.

BRIEF DESCRIPTION OF THE DRAWINGS

These and other features of this invention will be more readily understood from the following detailed description of the various aspects of the invention taken in conjunction with the accompanying drawings in which.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

DETAILED DESCRIPTION OF THE INVENTION

Illustrative embodiments will now be described more fully herein with reference to the accompanying drawings, in which embodiments are shown. This disclosure may, however, be embodied in many different forms and should not be construed as limited to the embodiments set forth herein. Rather, these embodiments are provided so that this disclosure will be thorough and complete and will fully convey the scope of this disclosure to those skilled in the art. In the description, details of well-known features and techniques may be omitted to avoid unnecessarily obscuring the presented embodiments.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. The term "set" is intended to mean a quantity of at least one. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer) is present on a second element, such as a second structure (e.g. a second layer) wherein intervening elements, such as an interface structure (e.g. interface layer) may be present between the first element and the second element.

As indicated above, aspects of the present invention relate to approaches for forming a semiconductor device such as a FinFET device through the use of multiple protective liners between bi-layers of refill. In a typical embodiment, a set of trenches will be etched in a substrate (e.g., silicon (Si). A shallow trench isolation (STI) layer will then be formed. The STI layer will include a first liner layer (e.g., an in-situ steam generation (ISSG)-based layer) and a second liner layer (e.g., silicon nitride (SiN) or poly-silicon). The set of trenches will then be filled (e.g., over the second liner layer) via an enhanced high aspect ratio process (eHARP) material, which will then be polished and etched back. The second liner layer will then be removed (e.g., via a hot phosphorous process, or a direct thermal treatment process depending on the material used in the second liner layer), and the set of trenches will be (re)filled with a high density plasma (HDP) material that is subsequently polished and etched back. In one embodiment, a silicon layer may be deposited after the second liner layer has been removed (but before the HDP fill) for additional protection during downstream wet/dry clean processes).

Figure 1:
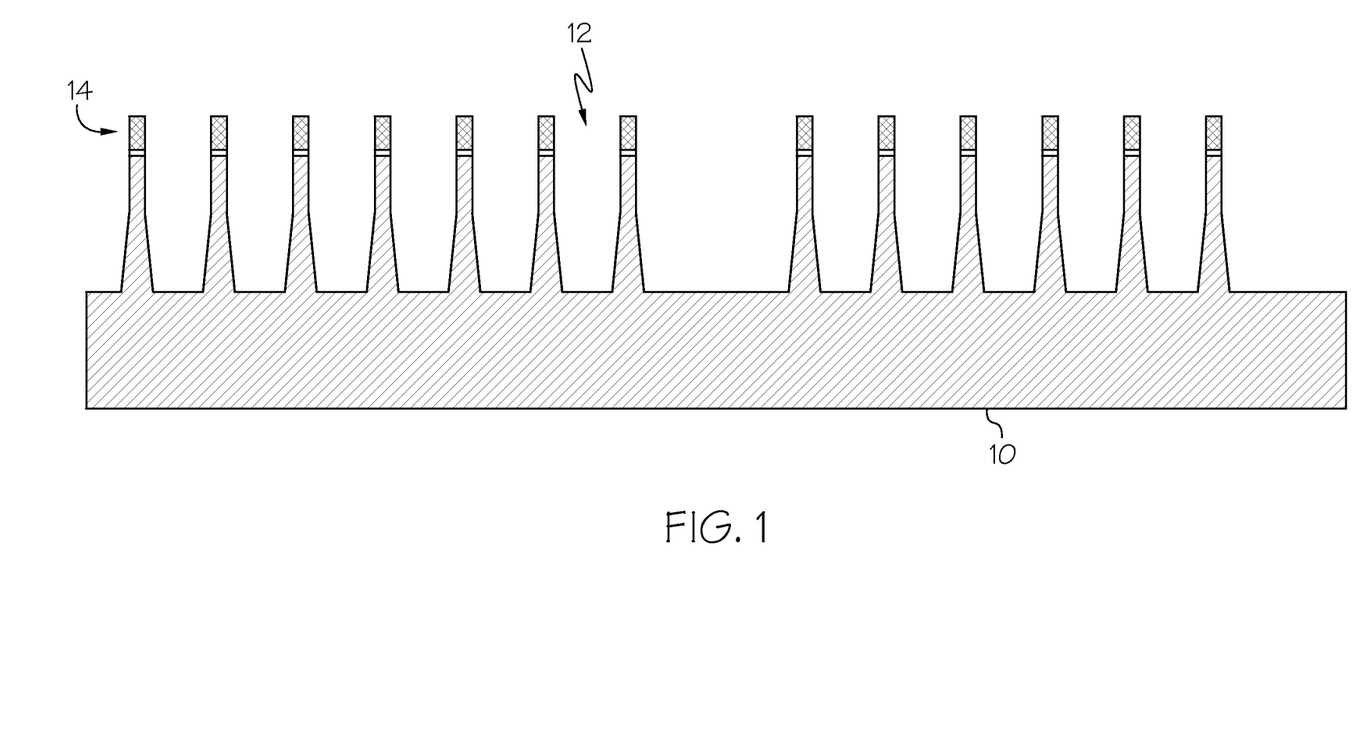
FIG. 1 shows a formation of a set of trenches in a substrate according to an embodiment of the present invention.
Figure 2:
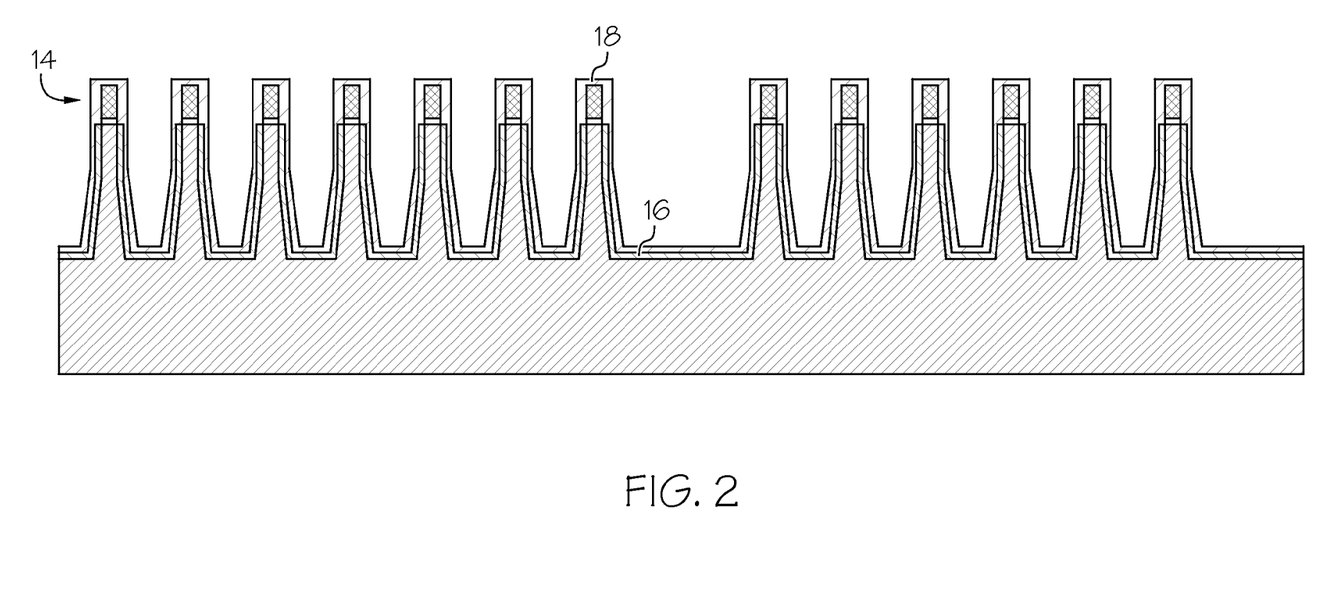
FIG. 2 shows a formation of a multi-layer STI liner according to an embodiment of the present invention.

Referring to FIG. 1, a substrate 10 is shown. Initially, a set of trenches 12 will be etched to yield a set of fins 14. Then, as shown in FIG. 2, a multi-layer STI liner will be formed over the etched substrate. Specifically, a first liner layer 16 will be applied over fins 14, and a second liner layer 18 will be applied over first liner layer 16. First liner layer 16 may be an ISSG liner to repair any Si surface damage post etching (e.g., to reduce leakage current). Second liner layer 18 generally is a protective liner to protect the SiN hard mask and pad oxide during/following the eHARP removal process. Along these lines, second liner layer 18 may be SiN or Poly-Si.

Figure 3:
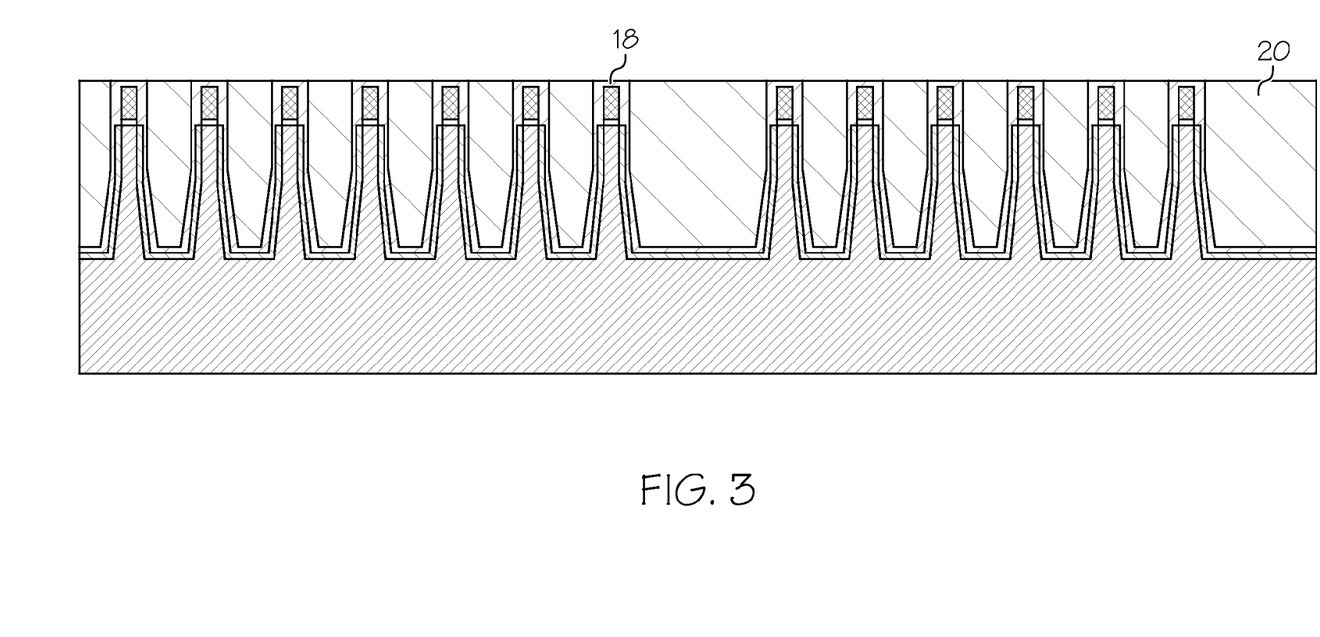
FIG. 3 shows an eHARP fill and chemical mechanical polishing (CMP) according to an embodiment of the present invention.
Figure 4:
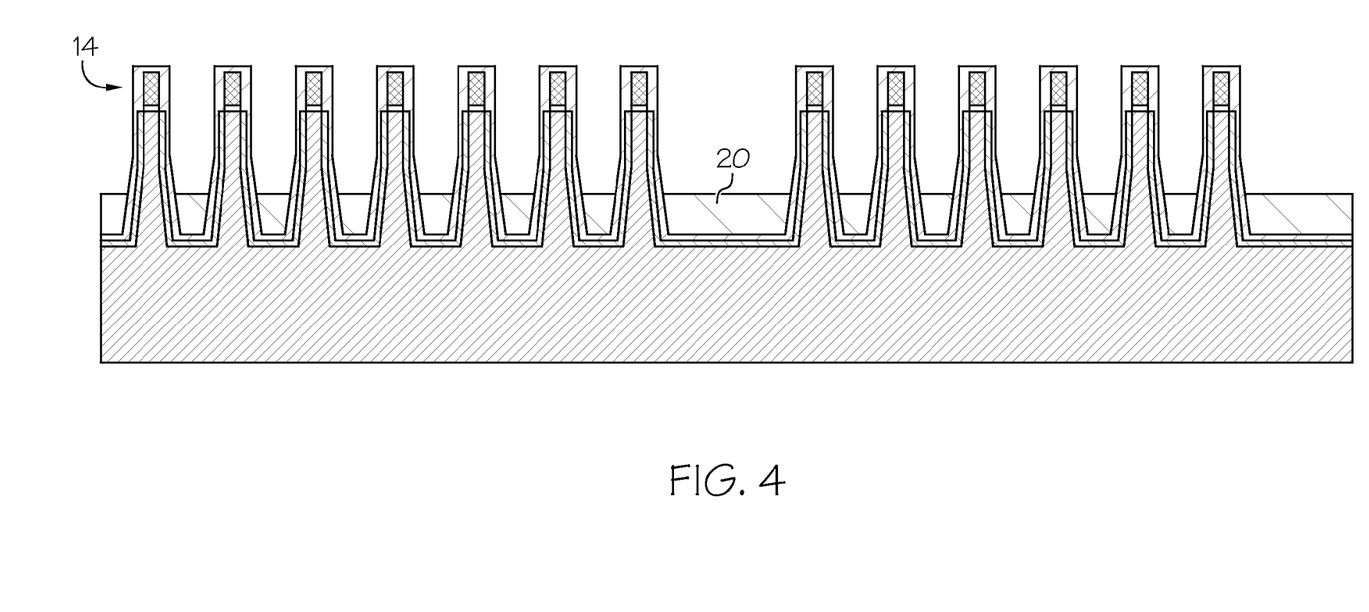
FIG. 4 shows etching back of the eHARP material according to an embodiment of the present invention.
Figure 5A:
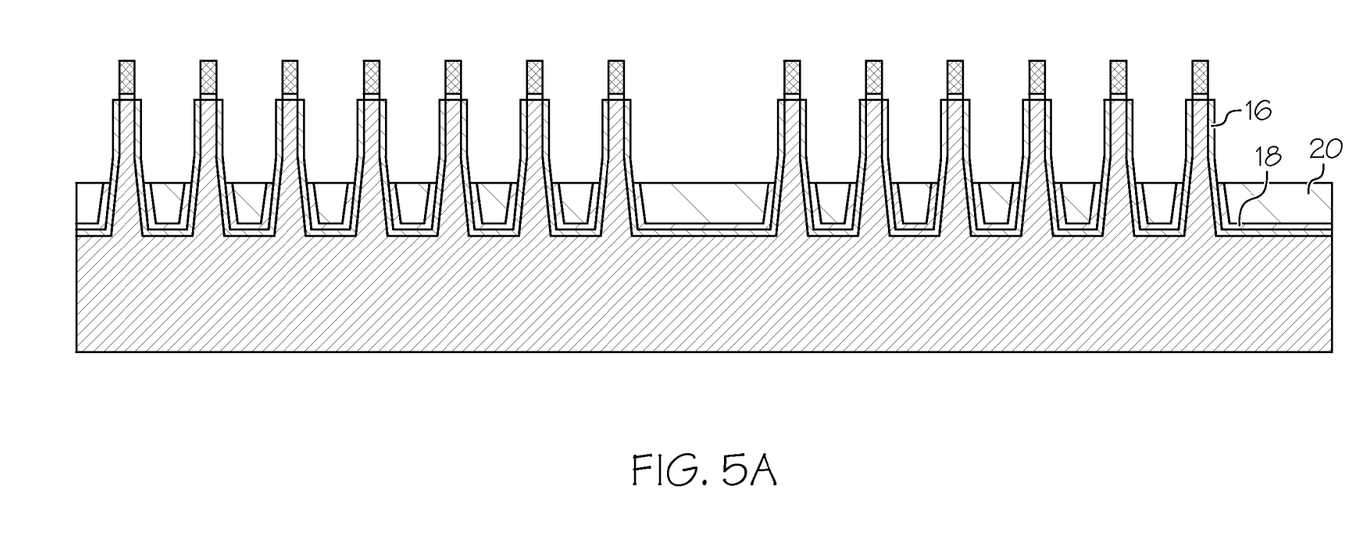
FIG. 5A shows removal of the second liner layer of FIG. 2 according to an embodiment of the present invention.
Figure 5B:
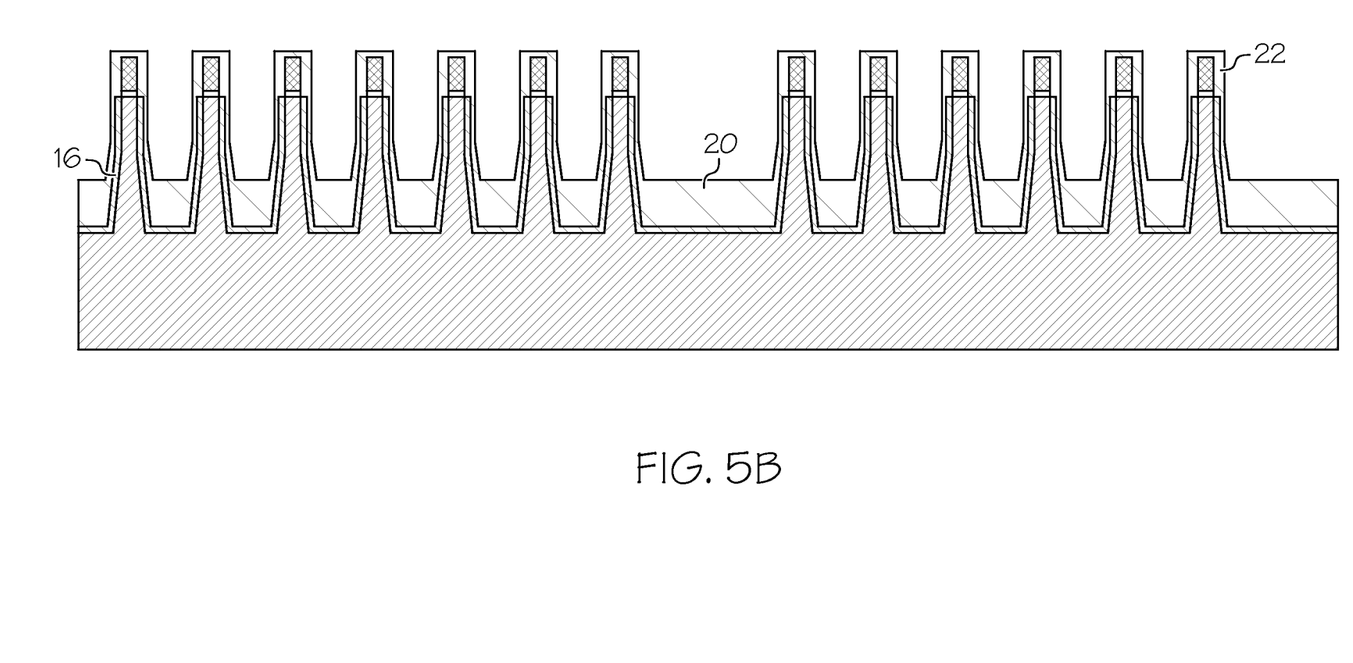
FIG. 5B shows removal of the second liner layer of FIG. 2 according to another embodiment of the present invention.

Referring now to FIG. 3, an eHARP fill 20 is performed over second liner layer 18 and subsequently polished (e.g., via CMP). Then, as shown in FIG. 4, eHARP fill 20 is etched back to a lower level along fins 14. FIGS. 5A-B shows two removal processes for second liner layer 18 depending on the material used.

FIG. 5A shows the removal of SiN second liner layer 18 from above eHARP material 20 along fins 14. In general, this may be accomplished using hot phosphorous techniques to remove liner layer 18, but keep the pad SiN as shown. Due to high selectivity between SiN and oxide remove rates (in hot phosphorous treatments), the ISSG liner 16 will remain after the SiN liner 18 removal. FIG. 5B shows the removal of a poly-silicon second liner layer 18 from the device. In this embodiment, when poly-silicon is used as a second liner layer instead of SiN) the device may be subjected to direct thermal treatment to oxidize the layer (now shown as oxidized layer 22).

Figure 6A:
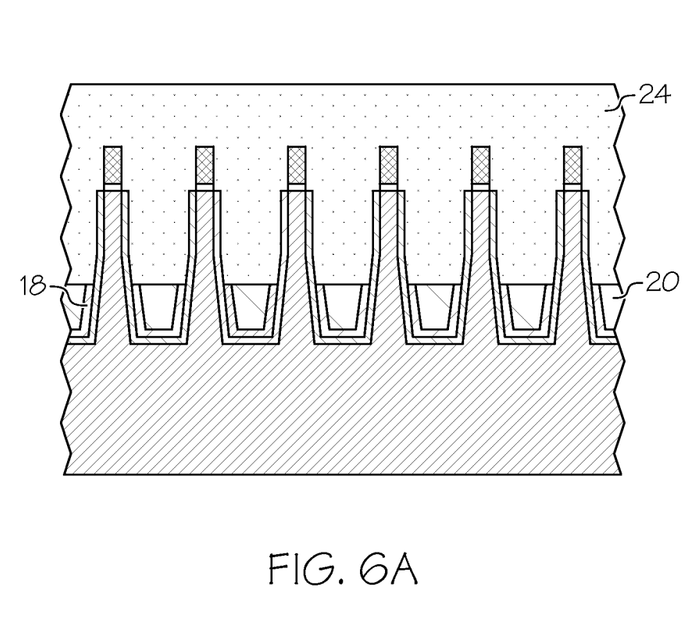
FIG. 6A shows a HDP refill of the device of FIG. 5A according to an embodiment of the present invention.
Figure 6B:
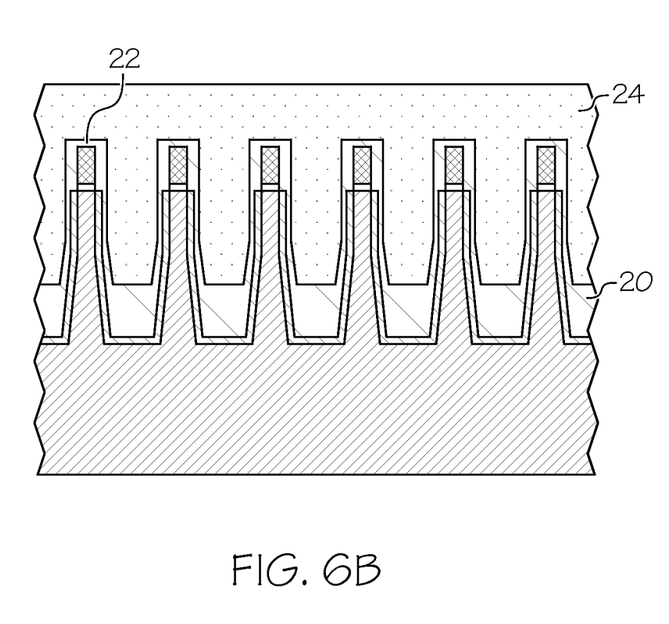
FIG. 6B shows a HDP refill of the device of FIG. 5B according to an embodiment of the present invention.
Figure 7:
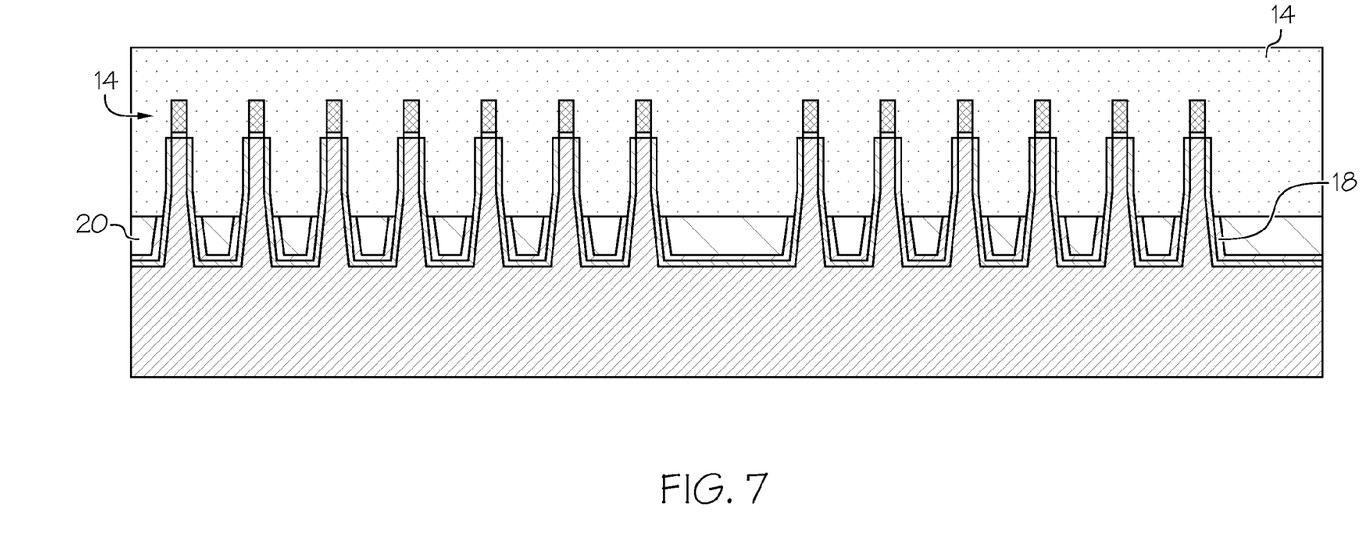
FIG. 7 shows a polishing of the device of FIG. 6A according to an embodiment of the present invention.

Referring to FIG. 6A, the device of FIG. 5A is shown after HDP refill 24. Specifically, FIG. 6A shows HDP refill 24 over remaining liner layer 18 and eHARP fill 20. FIG. 6B shows the device of FIG. 5B after HDP refill 24. Specifically, FIG. 6B shows HDP refill 24 over oxidized layer 22 and eHARP fill 20. FIG. 7 shows the device of FIG. 6A after HDP refill 24 has been polished (and/or etched) back to a top surface of fins 14. Although not shown for brevity purposes, it is understood that the device of FIG. 6B could be etched back in a similar manner.

Figure 8:
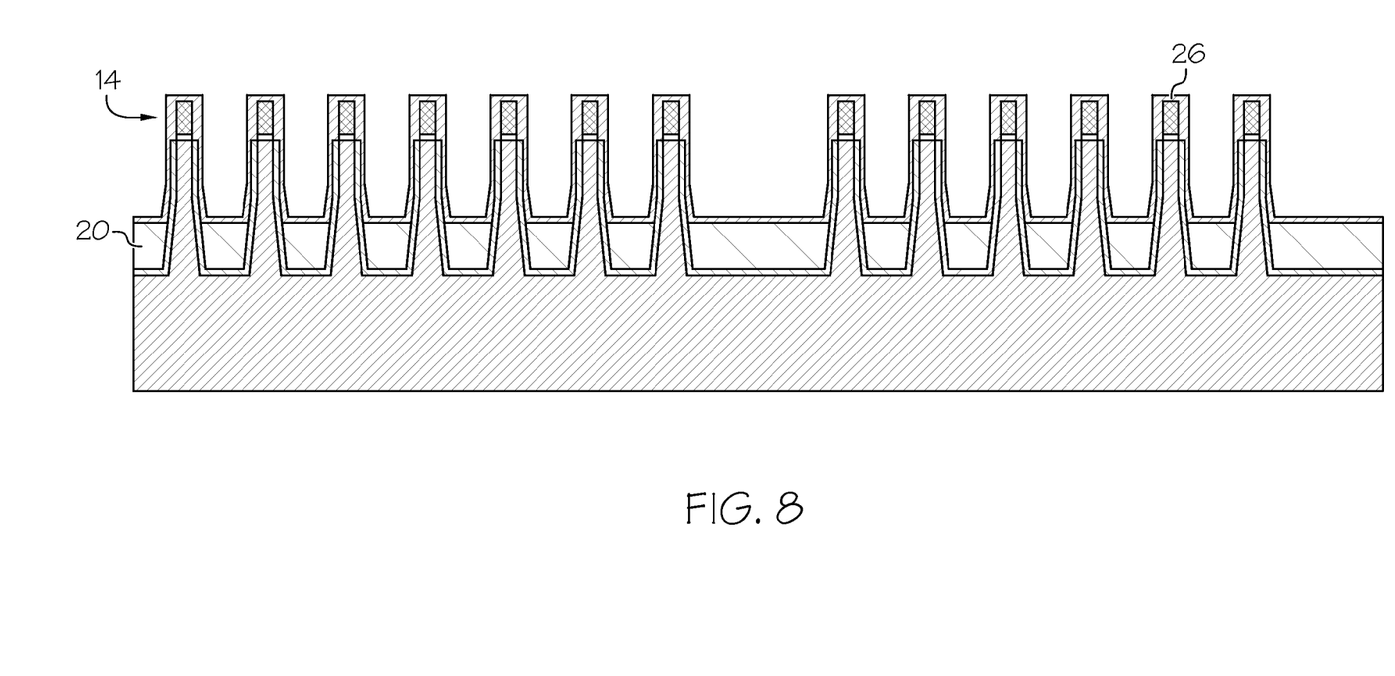
FIG. 8 shows the application of a silicon layer after the second liner layer has been removed in accordance with FIG. 5A according to an embodiment of the present invention.
Figure 9:
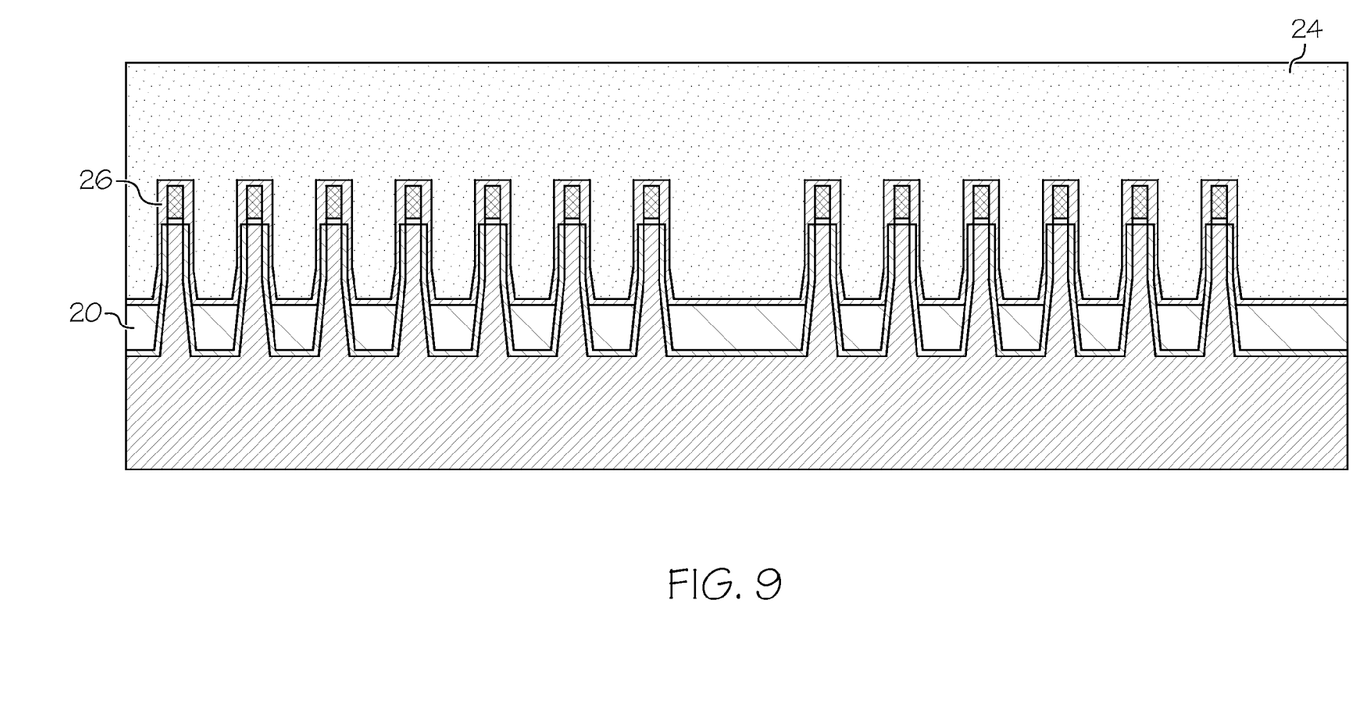
FIG. 9 shows a HDP refill of the device of FIG. 8 according to an embodiment of the present invention.
Figure 10:
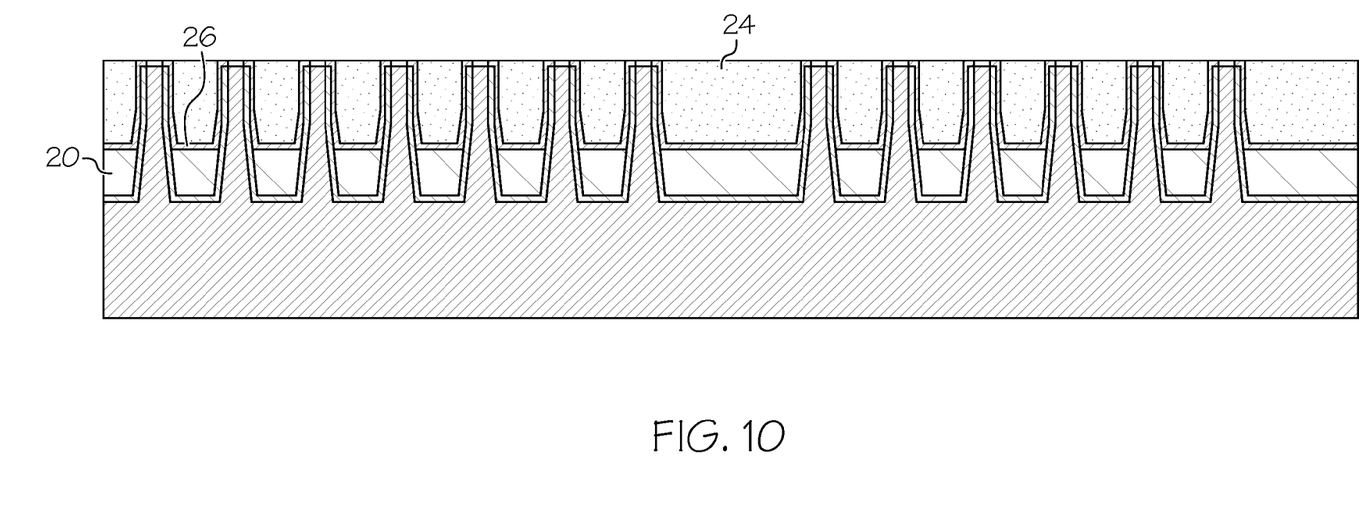
FIG. 10 shows a polishing of the device of FIG. 9 according to an embodiment of the present invention.
Figure 11:
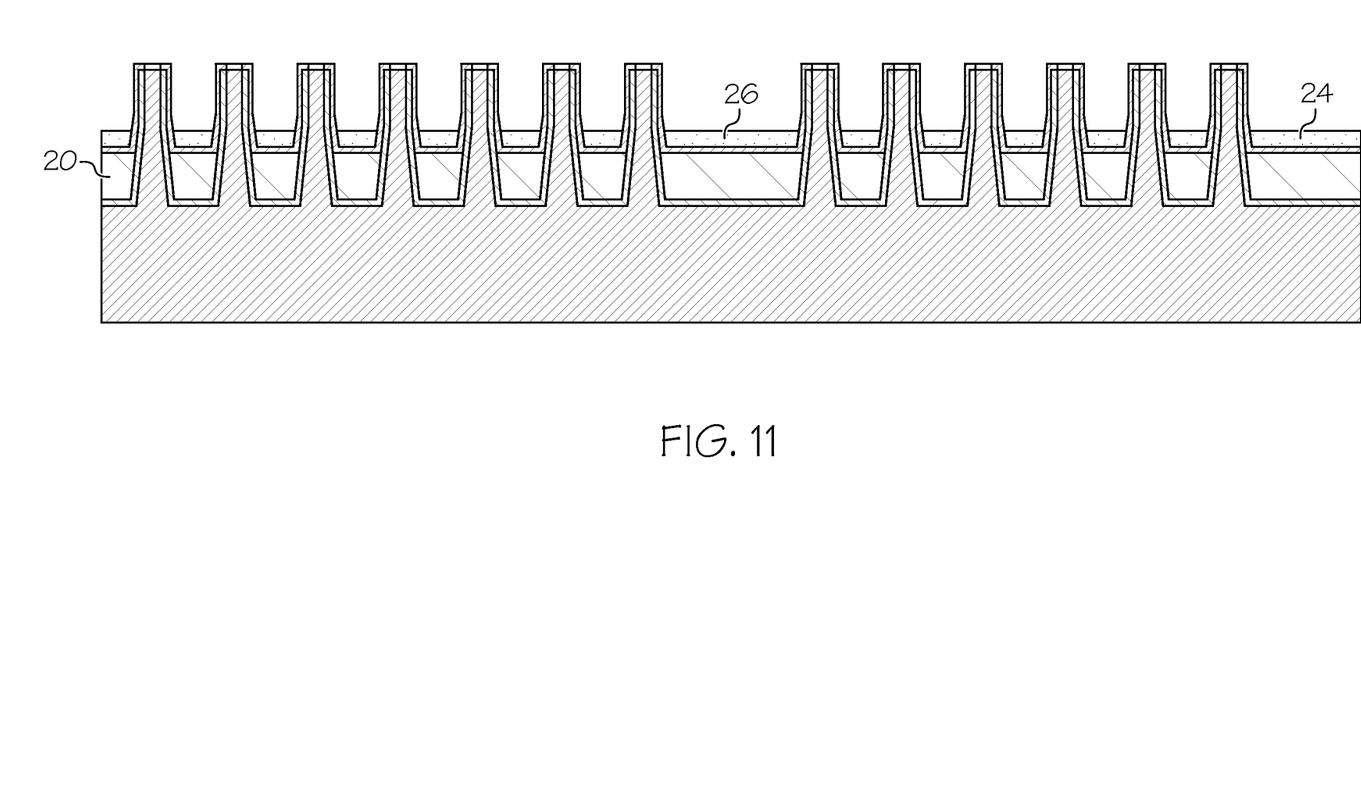
FIG. 11 shows an etching back of the HDP refill of the device of FIG. 10 according to an embodiment of the present invention.

Referring now to FIG. 8, another embodiment of the present invention is shown. Specifically, FIG. 8 shows the deposition (e.g., etch stop deposition) of a silicon layer 26 after the SiN second liner layer 18 of has been removed in accordance with FIG. 5A. In general, silicon layer 26 is a thin silicon layer applied using etch stop deposition. Due to high selectivity between Si to SiN and oxide removal rates, the "thin" silicon layer 26 will serve as a protective layer during downstream wet/dry clean processes. FIG. 9 shows the subsequent HDP refill 24 over silicon layer 26 and eHARP fill 20 (e.g., similar to FIGS. 6A-B). HDP refill is then polished and etched back as shown in FIG. 10 and FIG. 11, respectively.

In various embodiments, design tools can be provided and configured to create the data sets used to pattern the semiconductor layers as described herein. For example, data sets can be created to generate photomasks used during lithography operations to pattern the layers for structures as described herein. Such design tools can include a collection of one or more modules and can also include hardware, software, or a combination thereof. Thus, for example, a tool can be a collection of one or more software modules, hardware modules, software/hardware modules, or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, application-specific integrated circuits (ASIC), programmable logic arrays (PLA)s, logical components, software routines, or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method for forming a semiconductor device, comprising:
    etching a set of trenches in a substrate;
    forming a first liner layer over the set of trenches;
    forming a second liner layer over the first liner layer;
    filling the set of trenches over the second liner layer with a first fill material;
    polishing and etching back the first fill material to leave a portion of the first fill material remaining;
    removing the second liner layer disposed above the remaining portion of the first fill material to leave a portion of the second liner layer remaining and a portion of the first liner layer remaining disposed above the remaining portion of the first fill material;
    depositing a silicon layer after the second liner layer has been removed; and
    refilling the set of trenches with a second fill material, the second fill material being in contact with a portion of the first liner layer, overlying and/or in contact with the remaining portion of the second liner layer, and overlying and/or in contact with the remaining portion of the first fill material.

2. The method of claim 1, further comprising:
    polishing the second fill material; and
    etching back the second fill material.

3. The method of claim 1, the first liner layer comprising an in-situ steam generation (ISSG)-based layer.

4. The method of claim 1, the second liner layer being selected from a group consisting of: silicon nitride (SiN) and poly-silicon.

5. The method of claim 1, the filling comprising filling the set of trenches being filled via an enhanced high aspect ratio process (eHARP).

6. The method of claim 1, the refilling comprising refilling the set of trenches with a high density plasma (HDP).

7. The method of claim 1, further comprising a device formed according to the method of claim 1.

8. The method of claim 7, wherein the step of depositing the silicon layer is replaced by removing the second liner layer with a direct thermal treatment process.

9. A method for forming a semiconductor device, comprising:
    etching a set of trenches in a substrate;
    forming a first liner layer over the set of trenches;
    forming a second liner layer over the first liner layer;
    filling the set of trenches over the second liner layer via an enhanced high aspect ratio process (eHARP);
    polishing and etching the semiconductor device after the filling;
    removing the second liner layer, leaving a portion of the first liner layer disposed above the remaining portion of material filled by eHARP;
    depositing a silicon layer; and
    filling the set of trenches with a high density plasma (HDP) in such a way that the HDP is substantially fully surrounded at three sides thereof by the silicon layer.

10. The method of claim 9, further comprising:
    polishing the HDP; and
    etching back the HDP.

11. The method of claim 9, further comprising depositing the silicon layer after the second liner layer has been removed.

12. The method of claim 9, the first liner layer comprising an in-situ steam generation (ISSG)-based layer.

13. The method of claim 9, the second liner layer being selected from a group consisting of: silicon nitride (SiN) and poly-silicon.

14. The method of claim 9, the second liner layer being removed with at least one of the following: a hot phosphorous process, or a direct thermal treatment process.

15. The method of claim 9, further comprising a device formed according to the method of claim 9.

16. A method for forming a semiconductor device, comprising:
    etching a set of trenches in a substrate;
    forming a shallow trench isolation (STI) layer, the STI layer comprising a first liner layer and a second liner layer;
    filling the set of trenches over the second liner layer via an enhanced high aspect ratio process (eHARP);
    polishing and etching the semiconductor device after the filling;
    removing the second liner layer, leaving a portion of the first liner layer disposed above the remaining portion of material filled by eHARP;
    depositing a silicon layer;
    filling the set of trenches with a high density plasma (HDP) in such a way that the HDP is substantially fully surrounded at three sides thereof by the silicon layer;
    polishing the HDP; and
    etching back the HDP.

17. The method of claim 16, further comprising depositing the silicon layer after the second liner layer has been removed.

18. The method of claim 16, the first liner layer comprising an in-situ steam generation (ISSG)-based layer, and the second liner layer being selected from a group consisting of: silicon nitride (SiN) and poly-silicon.

19. A device formed according to the method of claim 16.

* * * * *